United States Patent
Leem

(10) Patent No.: US 9,331,087 B2
(45) Date of Patent: May 3, 2016

(54) METHOD OF MANUFACTURING A NONVOLATILE MEMORY DEVICE

(71) Applicant: SK hynix Inc., Icheon-Si (KR)

(72) Inventor: Jong Soon Leem, Seoul (KR)

(73) Assignee: SK hynix Inc., Icheon-Si (KR)

(*) Notice: Subject to any disclaimer, the term of this patent is extended or adjusted under 35 U.S.C. 154(b) by 0 days.

(21) Appl. No.: 14/530,988

(22) Filed: Nov. 3, 2014

(65) Prior Publication Data

US 2015/0050802 A1    Feb. 19, 2015

Related U.S. Application Data

(62) Division of application No. 12/793,336, filed on Jun. 3, 2010, now abandoned.

(30) Foreign Application Priority Data

Jun. 8, 2009  (KR) .................. 10-2009-0050439

(51) Int. Cl.
*H01L 27/115* (2006.01)
*H01L 21/28* (2006.01)

(52) U.S. Cl.
CPC .... *H01L 27/11517* (2013.01); *H01L 21/28273* (2013.01); *H01L 27/11521* (2013.01); *H01L 27/11524* (2013.01)

(58) Field of Classification Search
None
See application file for complete search history.

(56) References Cited

U.S. PATENT DOCUMENTS

| | | | |
|---|---|---|---|
| 6,593,188 B2 | 7/2003 | Cho | |
| 2005/0087817 A1 | 4/2005 | Zhang | |
| 2007/0126028 A1 | 6/2007 | Higashitani | |
| 2008/0089127 A1* | 4/2008 | Mokhlesi | G11C 11/5628 365/185.17 |
| 2008/0123433 A1* | 5/2008 | Sung | G11C 16/3427 365/185.26 |
| 2008/0128778 A1* | 6/2008 | Yang | 257/316 |
| 2008/0194098 A1 | 8/2008 | Shin | |
| 2009/0068829 A1* | 3/2009 | Lee | 438/594 |
| 2009/0098700 A1 | 4/2009 | Yang | |
| 2010/0283095 A1 | 11/2010 | Yang | |

FOREIGN PATENT DOCUMENTS

| | | |
|---|---|---|
| KR | 10-0781290 | 11/2007 |
| KR | 10-2008-0022373 | 3/2008 |
| KR | 10-2008-0050788 | 6/2008 |
| KR | 10-2008-0092543 | 10/2008 |

OTHER PUBLICATIONS

English translation of Jong-Sun Im, "Flash memory device and a method of manufacturing the same", published application KR-10-2008-0092543, obtained through K-PION, http://kposd.kipo.go.kr:8088/up/kpion/.*

* cited by examiner

*Primary Examiner* — Johannes P Mondt
(74) *Attorney, Agent, or Firm* — Marshall, Gerstein & Borun LLP

(57) ABSTRACT

A method of manufacturing a nonvolatile memory device comprises forming a gate insulating layer and a first conductive layer over a semiconductor substrate that defines a first area in which selection lines will be formed and a second area in which word lines will be formed, performing an etch process to lower a height of the first conductive layer in the first area, forming a dielectric layer and a second conductive layer over the first conductive layer with a height that is different from the height of the first conductive layer, and performing a gate patterning process to form the selection lines and the word lines.

3 Claims, 3 Drawing Sheets

Known art        This disclosure

METHOD OF MANUFACTURING A NONVOLATILE MEMORY DEVICE

CROSS-REFERENCE TO RELATED APPLICATIONS

This is a division of U.S. application Ser. No. 12/793,336 filed Jun. 3, 2010, which claims the priority benefit under U.S.C. 119 of Korean patent application number 10-2009-0050439 filed on Jun. 8, 2009, the entire respective disclosures of which are incorporated by reference herein.

BACKGROUND

An exemplary embodiment relates generally to a nonvolatile memory device and a method of manufacturing the same and, more particularly, to a nonvolatile memory device and a method of manufacturing the same, in which the height of selection lines is lower than the height of word lines, thereby being capable of preventing voids from occurring between the selection lines when an interlayer dielectric is formed.

In a nonvolatile memory device having a string structure, to reduce the size of the string, the size of cells, the size of selection lines, and the size of a space between the selection lines is reduced. With the size of the space between the selection lines being reduced, the gap-fill margin of an insulating layer for filling the space is reduced. Accordingly, in a process of forming the insulating layer, voids may be generated in the space portion. If drain contact holes or source contact holes are formed with the voids present, it is difficult to obtain contact holes of a desired form. Furthermore, a breakdown voltage margin between the selection line and the drain contact plug or between the selection line and the source contact plug is reduced, the rate of device failure is increased, and a breakdown voltage margin between the drain contact plugs is also reduced, also resulting in device failure. To prevent the occurrence of the voids, a deposition process and an etch process are repeatedly performed on the insulating layer to fill the space. In this case, however, manufacturing turnaround time and costs are increased because of the additional process steps.

BRIEF SUMMARY

In accordance with an exemplary embodiment, the aspect ratio between selection lines is reduced by lowering the height of the selection lines. Accordingly, voids can be prevented from occurring when an interlayer dielectric is formed.

A method of manufacturing a nonvolatile memory device according to an aspect of the disclosure comprises forming a gate insulating layer and a first conductive layer over a semiconductor substrate that defines a first area in which selection lines will be formed and a second area in which word lines will be formed, performing an etch process to lower the height of the first conductive layer in the first area, forming a dielectric layer and a second conductive layer over the first conductive layer with a height that is different from the height of the first conductive layer, and performing a gate patterning process to form the selection lines and the word lines.

The method preferably further comprises, after performing the gate patterning process, forming a spacer on sidewalls of the word lines and the selection lines, forming an etch-stop layer on a surface of a structure including the spacer, the word lines, and the selection lines, and forming an interlayer dielectric over the etch-stop layer.

The etch process preferably is a dry etch process.

The etch process is preferably is performed to form a recess mask pattern, having the first area open and the second area closed, over the first conductive layer.

The method preferably further comprises forming a buffer layer over the first conductive layer before forming the recess mask pattern.

An aspect ratio between the selection lines preferably is reduced as much as a reduction in the height of the first conductive layer in the first area.

A nonvolatile memory device according to another aspect of the disclosure comprises selection lines and word lines formed by sequentially stacking a gate insulating layer, a first conductive layer, a dielectric layer, and a second conductive layer over a semiconductor substrate. Here, the height of the first conductive layer of the selection lines is lower than the height of the first conductive layer of the word lines.

The first conductive layer and the second conductive layer of the selection lines preferably are interconnected through contact holes.

DESCRIPTION OF EMBODIMENTS

Figure 1A:
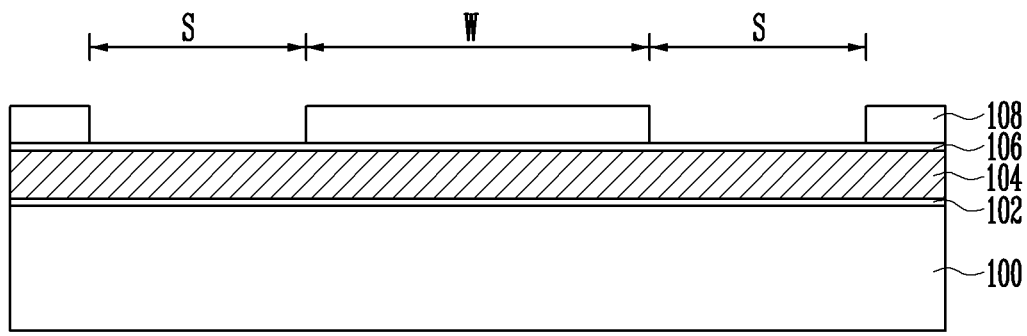
FIGS. 1A to 1F are cross-sectional views showing a nonvolatile memory device and a method of manufacturing the same according to an exemplary embodiment of this disclosure.

Hereinafter, an exemplary embodiment of the disclosure will be described in detail with reference to the accompanying drawings. The drawing figures are provided to allow those having ordinary skill in the art to understand the scope of the embodiment of the disclosure.

FIGS. 1A to 1F are cross-sectional views showing a nonvolatile memory device and a method of manufacturing the same according to an exemplary embodiment of this disclosure.

Referring to FIG. 1A, a gate insulating layer 102 for electron tunneling and a first conductive layer 104 for floating gates are formed over a semiconductor substrate 100. The gate insulating layer 102 preferably comprises an oxide layer. The first conductive layer 104 preferably comprises a doped polysilicon layer or may be formed by stacking an undoped polysilicon layer and a doped polysilicon layer. A buffer layer 106 and a recess mask pattern 108 are formed over the first conductive layer 104. The buffer layer 106 is used to protect the surface of the conductive layer 104 when the recess mask pattern 108 is formed or removed and preferably comprises an oxide layer. The recess mask pattern 108 is formed to open a first area S in which selection lines will be formed and to close a second area W in which word lines will be formed. The recess mask pattern 108 preferably comprises an SiON layer or an $Si_3N_4$ layer. Here, the recess mask pattern 108 preferably is formed using an etchant in which $CHF_3$ and $O_2$ are mixed.

Figure 1B:
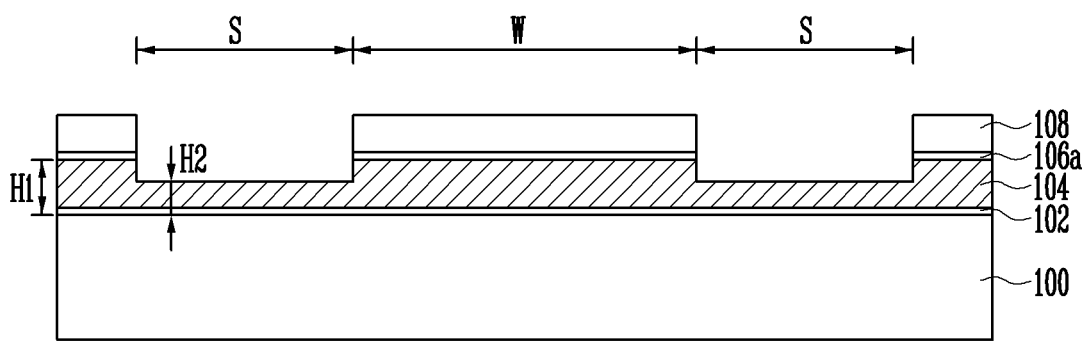

Referring to FIG. 1B, a recess process of lowering the height of part of the first conductive layer 104 is performed using the recess mask pattern 108. The recess process is described in detail below. The buffer layer 106 exposed through the recess mask pattern 108 is patterned to form buffer patterns 106a. Next, an etch process is performed on the exposed first conductive layer 104, thereby lowering the height of the first conductive layer 104. The etch process can be a dry or wet etch process, but preferably is a dry etch process in order to minimize the loss of the first conductive layer 104. Accordingly, the height H2 of the first conductive layer 104 in the first area S in which selection lines will be formed is lower than the height H1 of the first conductive layer 104 in the second area W in which word lines will be formed.

Figure 1C:
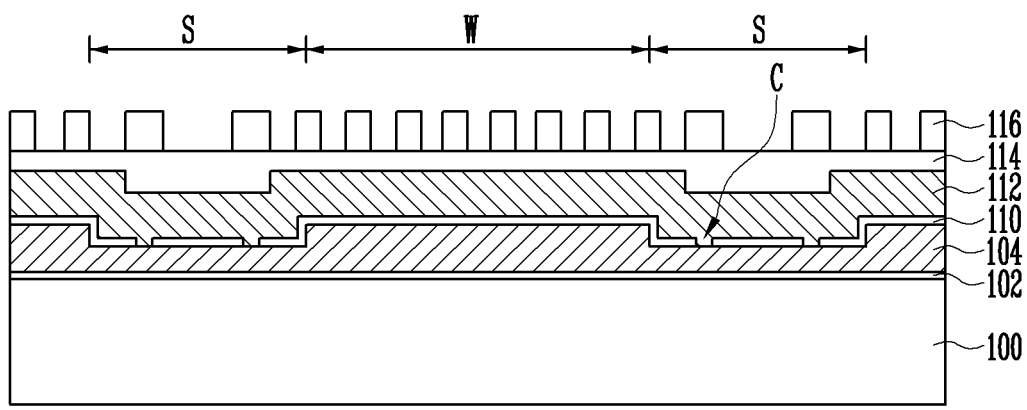

Referring to FIG. 1C, after the recess mask pattern 108 and the buffer patterns 106a are removed, a dielectric layer 110 and a second conductive layer 112 for control gates are formed on the entire surface of the first conductive layer 104. The dielectric layer 110 preferably comprises an oxide layer or is formed by stacking a nitride layer and an oxide layer. Contact holes C are formed in the first area in which selection lines will be formed so that the first conductive layer 104 and the second conductive layer 112 are electrically coupled together. The second conductive layer 112 preferably comprises a doped polysilicon layer. Next, a hard mask layer 114 and a photoresist pattern 116 for gate patterning are formed over the second conductive layer 112.

Figure 1D:
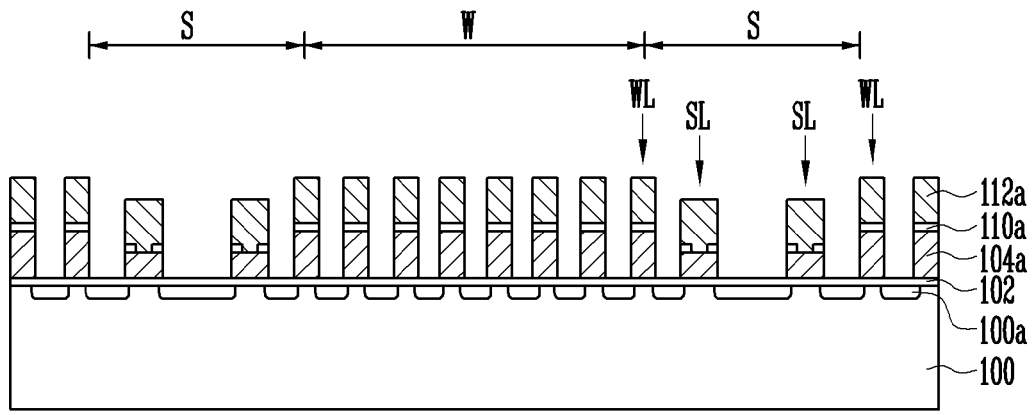

Referring to FIG. 1D, an etch process using the photoresist pattern 116 is performed to etch the hard mask layer 114, thereby forming hard mask patterns (not shown). An etch process using the hard mask patterns is performed to pattern the second conductive layer 112, the dielectric layer 110, and the first conductive layer 104, thereby forming the second conductive patterns 112a, dielectric patterns 110a, and first conductive patterns 104a. Consequently, the word lines WL and the selection lines SL are formed. Next, an ion implantation process is performed to form impurity ion implantation areas 100a in the semiconductor substrate 100 exposed between the word lines WL and the selection lines SL. Next, the photoresist pattern 116 and the hard mask patterns (not shown) are removed. Accordingly, the height of the selection lines WL becomes lower than that of the word lines WL.

Figure 1E:
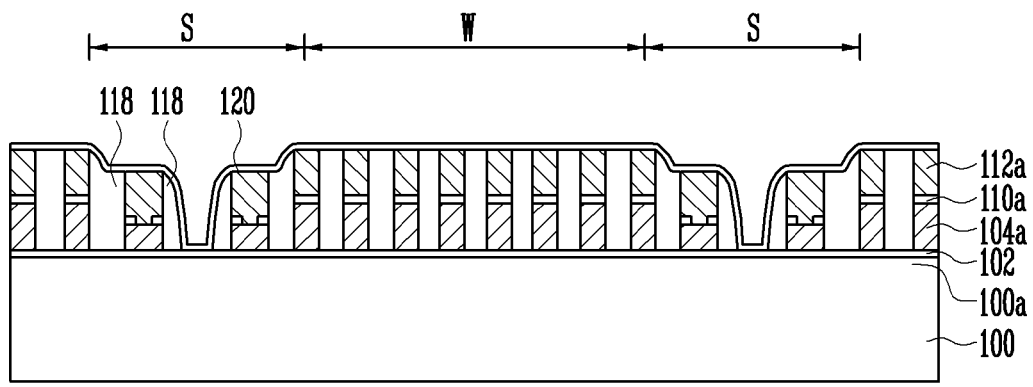

Referring to FIG. 1E, a spacer 118 is formed on the sidewalls of the word lines WL and the selection lines SL. The spacer 118 preferably comprises an oxide layer. An etch-stop layer 120 is formed on the entire surface of the word lines WL, the selection lines SL, and the exposed gate insulating layer 102, including the spacer 118. The etch-stop layer 120 preferably comprises a nitride layer.

Figure 1F:
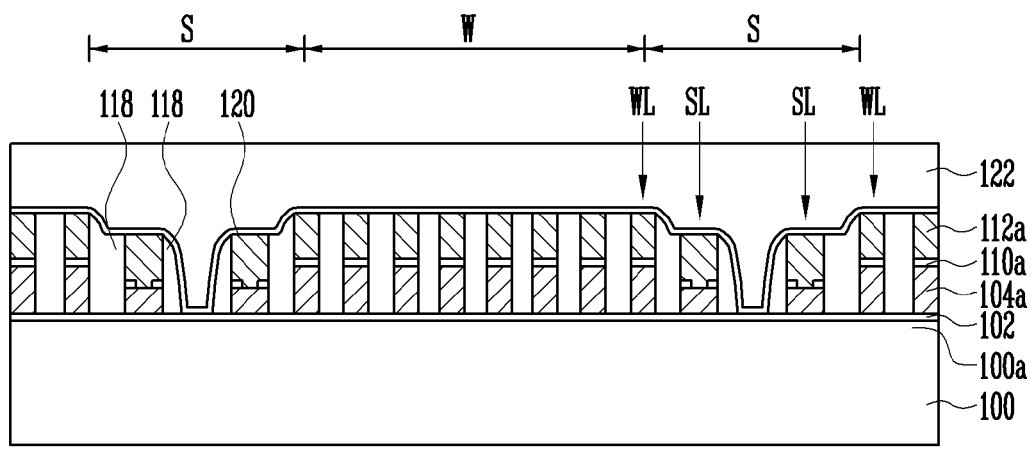

Referring to FIG. 1F, an interlayer dielectric 122 is formed over the etch-stop layer 120. The interlayer dielectric 122 preferably comprises an oxide layer, for example, a TEOS (tetra ethyl ortho silicate) layer.

As described above, the distance between the selection lines SL remains intact, but the height of the selection lines SL is lowered. Accordingly, the aspect ratio of a space between neighboring selection lines SL can be reduced, and so voids are not generated in the interlayer dielectric 122 in the space between the selection lines SL.

Figure 2:
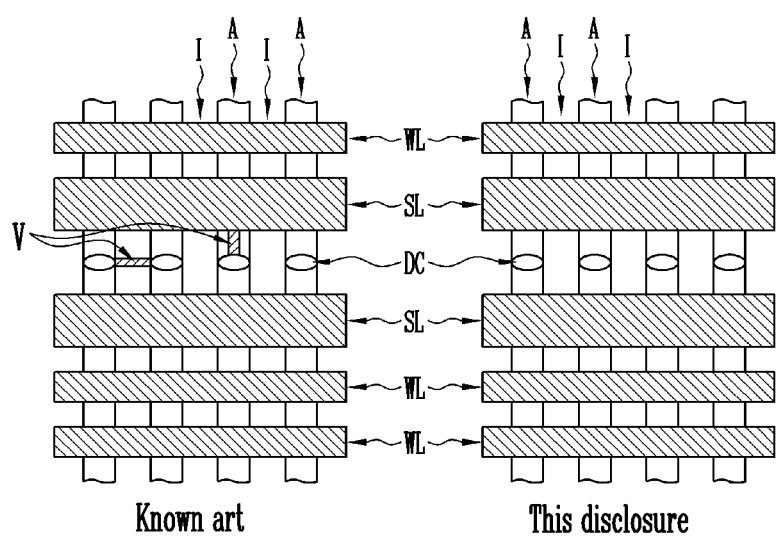
FIG. 2 is a plan view showing a known nonvolatile memory device and the nonvolatile memory device of this disclosure.

FIG. 2 is a plan view showing a known nonvolatile memory device and the nonvolatile memory device of this disclosure. This drawing shows that contact plugs DC are formed in active areas A between the selection lines SL after the interlayer dielectric 122 shown in FIG. 1F are formed.

As shown in FIG. 2, the known nonvolatile memory device has a high probability that voids V will occur because the height of the selection lines SL is not lowered unlike the nonvolatile memory device of this disclosure. When the voids V are generated, a bridge can occur between neighboring contact plugs DC or between the contact plug DC and the selection line SL.

In this disclosure, however, the occurrence of voids can be prevented because the aspect ratio between the contact plugs DC and between the contact plug DC and the selection line SL can be reduced by lowering the height of the selection line SL.

Since the occurrence of voids is prevented as described above, a bridge can be prevented from occurring. Accordingly, a reduction in the reliability of the nonvolatile memory device can be prevented. Furthermore, since the occurrence of a void can be easily prevented, the number of processes of forming the interlayer dielectric needs not to be increased. Accordingly, the manufacturing turnaround time and costs can be reduced.

In accordance with this disclosure, the aspect ratio between the selection lines is reduced by lowering the height of the selection lines. Accordingly, when the interlayer dielectric is formed, the occurrence of voids can be prevented. Consequently, a breakdown voltage margin between the selection line and the drain contact plug, between the selection line and the source contact plug, and between the drain contact plugs can be guaranteed, so device failure can be prevented. Furthermore, the manufacturing turnaround time and costs can be reduced because a deposition process and an etch process for the interlayer dielectric need not to be performed several times.

What is claimed is:

1. A method of manufacturing a nonvolatile memory device, the method comprising:
    forming a gate insulating layer on a semiconductor substrate, wherein a first area in which selection lines are formed and a second area in which word lines are formed are defined in the semiconductor substrate;
    forming a first conductive layer and a buffer layer on the gate insulating layer, wherein the first conductive layer has a first height from a top surface of the semiconductor substrate to an uppermost surface of the first conductive layer;
    etching the first conductive layer and the buffer layer in the first area by a recess mask pattern disposed on the buffer layer, thereby lowering the first conductive layer in the first area from the first height to a second height and patterning the buffer layer, wherein the first conductive layer formed in the second area has the first height;
    removing the recess mask pattern and the patterned buffer layer;
    forming a dielectric layer on the first conductive layer formed in the first area and the second area;
    forming a second conductive layer on the dielectric layer while maintaining a height difference of the first conductive layer, the dielectric layer and the second conductive layer the first area and the second area; and,
    patterning the second conductive layer, the dielectric layer, and the first conductive layer thereby forming a plurality of selection lines adjacent to each other in the first area and a plurality of word lines adjacent to each other in the second area, whereby an aspect ratio between the selection lines relative to an aspect ratio between the word lines is reduced by the lowering of the first conductive layer to said second height.

2. The method of claim 1, further comprising:
    after the patterning of the second conductive layer, the dielectric layer, and the first conductive layer, forming a spacer on sidewalls of the word lines and the selection lines;
    forming an etch-stop layer over a surface of a structure including the spacer, the word lines, and the selection lines; and,
    forming an interlayer dielectric over the etch-stop layer.

3. The method of claim 1, wherein the step of etching comprises etching by a dry etching process.

* * * * *